US006821873B2

(12) United States Patent
Visokay et al.

(10) Patent No.: US 6,821,873 B2
(45) Date of Patent: Nov. 23, 2004

(54) ANNEAL SEQUENCE FOR HIGH-κ FILM PROPERTY OPTIMIZATION

(75) Inventors: Mark R. Visokay, Richardson, TX (US); Luigi Colombo, Dallas, TX (US); Antonio L. P. Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/185,326

(22) Filed: Jun. 28, 2002

(65) Prior Publication Data

US 2003/0129817 A1 Jul. 10, 2003

Related U.S. Application Data

(60) Provisional application No. 60/347,331, filed on Jan. 10, 2002.

(51) Int. Cl.[7] .......................................... H01L 21/3105
(52) U.S. Cl. ...................... 438/591; 438/785; 438/786
(58) Field of Search ............................... 438/240, 287, 438/591, 770, 771, 775, 776, 785, 786

(56) References Cited

U.S. PATENT DOCUMENTS

| | | | | |
|---|---|---|---|---|
| 4,115,914 A | * | 9/1978 | Harari ........................ 438/157 |
| 5,876,788 A | * | 3/1999 | Bronner et al. ................ 427/81 |
| 6,013,553 A | * | 1/2000 | Wallace et al. .............. 438/287 |
| 6,020,243 A | * | 2/2000 | Wallace et al. .............. 438/287 |
| 6,162,744 A | * | 12/2000 | Al-Shareef et al. .......... 438/785 |
| 6,204,203 B1 | * | 3/2001 | Narwankar et al. .......... 438/785 |
| 6,444,592 B1 | * | 9/2002 | Ballantine et al. ........... 438/770 |
| 6,562,491 B1 | * | 5/2003 | Jeon ........................... 428/697 |
| 2002/0142624 A1 | * | 10/2002 | Levy et al. .................. 438/786 |
| 2003/0057432 A1 | * | 3/2003 | Gardner et al. .............. 257/100 |

FOREIGN PATENT DOCUMENTS

EP            973189 A2 *  1/2000    ........... H01L/21/28

OTHER PUBLICATIONS

Milton Ohring, "The Materials Science of Thin Films," Academic Press, San Diego, CA, 1992, pp. 8–9.*

* cited by examiner

*Primary Examiner*—Erik J. Kielin
*Assistant Examiner*—Stephen W. Smoot
(74) *Attorney, Agent, or Firm*—Jacqueline J. Garner; W. James Brady, III; Frederick J. Telecky, Jr.

(57) ABSTRACT

A method for improving high-κ gate dielectric film (104) properties. The high-κ film (104) is subjected to a two step anneal sequence. The first anneal is a high temperature anneal in a non-oxidizing ambient (106) such as $N_2$ to densify the high-κ film (104). The second anneal is a lower temperature anneal in an oxidizing ambient (108) to perform a mild oxidation that heals the high-κ film and reduces interface defects.

22 Claims, 2 Drawing Sheets

ANNEAL SEQUENCE FOR HIGH-κ FILM PROPERTY OPTIMIZATION

This application claims priority under 35 USC § 119(e)(1) of provisional application No. 60/347,331 filed Jan. 10, 2002.

FIELD OF THE INVENTION

The invention is generally related to the field of forming high dielectric constant (high-κ) films in semiconductor devices and more specifically to forming high-κ gate dielectrics.

BACKGROUND OF THE INVENTION

As semiconductor devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. This performance is often expressed as "equivalent oxide thickness": although the alternative material layer may be thick, it has the equivalent effect of a much thinner layer of silicon dioxide (commonly called simply "oxide"). In some instances, silicon dioxide has been replaced with a SiON. However, even higher-K dielectrics will soon be needed. Some films currently being investigated include deposited oxides or nitrides such as HfSiO, HfSiON, AlON, and AlZrO. Manufacturable processes for incorporating these materials are needed.

DETAILED DESCRIPTION OF THE EMBODIMENTS

High-κ dielectric films currently being considered to replace SiON are typically deposited oxides or nitrides such as HfSiO, HfSiON, AlON, or AlZrO. Deposition techniques such as CVD (chemical vapor deposition), PVD (physical vapor deposition), ALD (atomic layer deposition), and MBE (molecular beam epitaxy) may be used to form these films. The macroscopic composition (e.g., metal:Si ratio) of the films is reasonably easy to control during fabrication, but the defect content (e.g., point defects like oxygen vacancies) is usually not. Additionally, depending upon the deposition type and precursor materials used, unwanted species such as C, CH, OH, $CO_3$, etc. can be incorporated into the film. Both point defects as well as unwanted impurities are detrimental to the electrical properties of the dielectric film. Finally, the films may not be fully densified.

Because of the presence of defects after deposition, it is generally desirable to use an oxidizing ambient anneal in order to improve the film properties after deposition. This anneal can have the effects of reducing defects and ensuring that the film has the correct amount of oxygen. Additionally, for CVD films, this oxidation anneal can help to remove carbon and/or OH from the film. This effect is expected to result in reduced leakage currents and possibly improved interface characteristics. However, this oxidizing anneal can also cause the growth of a lower dielectric-constant layer (primarily made up of $SiO_2$) between the high-κ gate material and the Si substrate. Low temperature oxidizing anneals avoid increases in the EOT (effective oxide thickness) but does not allow for densification. Non-oxidizing (e.g., Ar, He or $N_2$) high temperature anneals allow for densification but typically do not heal defects or adjust for non-stoiciometry.

The current invention provides a means to use the oxidation anneals to heal defects and improve the film properties while at the same time preventing the formation of unwanted lower dielectric constant interface layers. An embodiment of the invention uses a two-step anneal wherein the first step is a high temperature anneal in a non-oxidizing ambient and the second step is a low temperature oxidizing anneal.

Figure 1:
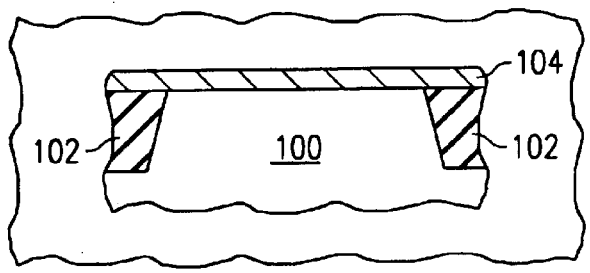
FIGS. 1–4 are cross-sectional diagrams of a high-κ gate dielectric formed according to an embodiment of the invention at various stages of fabrication.

The invention will now be described in conjunction with a method for forming a MOSFET transistor. Referring to FIG. 1, a semiconductor body 100 is processed through the formation of isolation structures 102. A high-κ gate dielectric 104 is formed at the surface of semiconductor body 100. High-κ dielectric 104 may, for example, comprise a deposited metal-nitride, metal-oxide or metal-oxynitride such as MN, MO, MON. MStO, MSiN, MSiON, MAIO, MAIN, MAION, MAISIO, MAISIN, or MAISION, where M Is Zr, Hf, La, Y, GD, Eu, Pr, or Ce. U.S. Pat. Nos. 8,291,886 issued Sep. 18, 2001, 6,291,867 issued Sep. 18, 2001, 6,020,243 issued Feb. 1, 2000, and 6,013,553 issued Jan. 11, 2000, assigned to Texas Instruments Incorporated and Incorporated herein by reference, describe processes for forming Zr or Hf oxynitride and silicon-oxynitride gate dielectrics.

Figure 2:
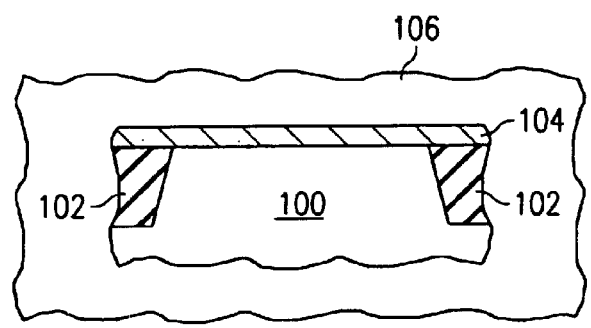

Referring to FIG. 2, high-κ gate dielectric 104 is subjected to a first anneal. The first anneal occurs in a non-oxidizing ambient 106. The non-oxidizing ambient 106 may, for example, comprise $N_2$. Other inert ambients such as Ar or He may alternatively be used. The first anneal is a higher temperature anneal, preferably in the range of 700° C. to 1100° C. As an example, the first anneal may be performed at 1000° C. in a $N_2$ ambient for 60 sec. The purpose of the first anneal is to densify the high-κ gate dielectric 104.

Figure 3:
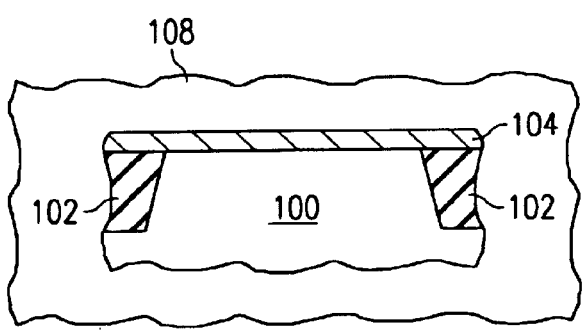

Referring to FIG. 3, high-κ dielectric 104 is subjected to a second (mild oxidation) anneal to heal the film and interface defects. The second anneal occurs in an oxidizing ambient 108. The oxidizing ambient 108 may, for example, comprise $O_2$. Other examples include $N_2O$, NO, ozone, UV $O_2$, and $H_2O_2$. The second anneal is a lower temperature anneal and may be a thermal anneal, with or without UV exposure, or a low temperature plasma process. The lower temperature is not greater than that of the first anneal (e.g., room temperature to 1000° C.). The temperature, time and pressure of the second anneal are chosen so as not to significantly increase the EOT. Reduced pressure is helpful in avoiding oxide growth (increased EOT). With reduced pressures, higher temperatures can be used. The oxidizer partial pressure may be in the range of mTorr to 1 atm. For example, the second anneal may be performed at 700° C. in $O_2$ for 60 sec at 1 Torr.

The first and second anneals may be separate processes or run as two steps within one recipe. For example, depending on the anneal tool configuration, this dual anneal sequence could be done in a single processing run with a multistep annealing recipe.

Figure 4:
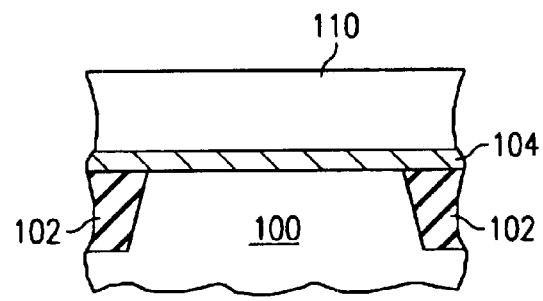

After the first and second anneals, a gate electrode material 110 is deposited over the high-κ gate dielectric 104, as shown in FIG. 4. Processing then continues by patterning and etching to form the gate electrode, forming the source/drain junction regions, forming interconnects and packaging the device.

Table I below shows the EOT and leakage current for various anneals: no anneal (NONE); high temperature non-oxidizing anneal only (1000° C. $N_2$); low temperature oxidizing anneal only at reduced pressure (700° C. $O_2$ 1 Torr); and two step anneal (1000° C. $N_2$+700° C. $O_2$ 1 Torr). The two step anneal according to the embodiment of the invention results in lower leakage current than the unannealed case and reduced leakage current at the same EOT compared to the $N_2$ anneal only case. The two-step anneal also maintains lower EOT than the single $O_2$ anneal case.

TABLE I

| Anneal | EOT (Å) | Jg (A/cm$^2$) |
|---|---|---|
| None | 13 ± 1.7 | 4.4 ± 0.62 |
| 1000° C. $N_2$ | 13.6 ± 0.54 | 1.3 ± 0.13 |
| 700° C. $O_2$ 1 Torr | 14.5 ± 0.8 | 1.4 ± 0.15 |
| 1000° C. $N_2$ + 700° C. $O_2$ 1 Torr | 13.6 ± 0.4 | 0.7 ± 0.08 |

Figure 5:
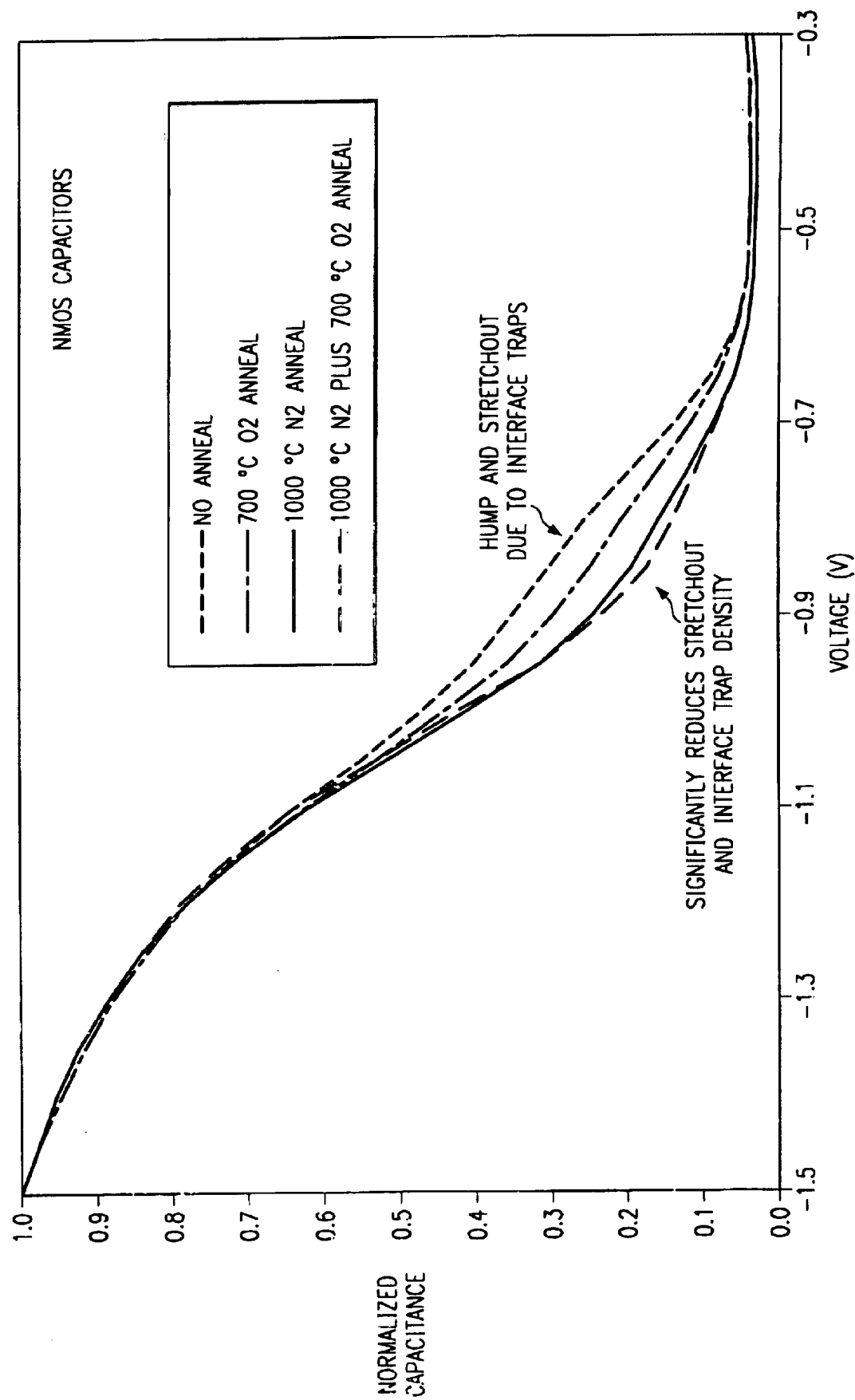
FIG. 5 is a graph of a C-V curve for a capacitor having a high-κ gate dielectric formed under various anneal conditions.

FIG. 5 is a C-V curve for the four conditions of Table I. There is a significant hump and stretchout for the unannealed and $O_2$ single anneal. This is due to interface traps, there is a significant reduction in the hump and stretchout for the $N_2$ only anneal, but the best CV curve is for the two-step anneal sequence. The two-step anneal shows the least hump and stretchout due to interface traps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the following steps performed in order:
   depositing a high-κ gate dielectric over a surface of a semiconductor body, wherein said high-κ gate dielectric comprises a material selected from the group consisting of MN, MO, MON, MSiO, MSiN, MSiON, MAIO, MAIN, MAION, MAISiO, MAISIN, or MAISiON, where M is Zr, Hf, La, Y, Gd, Eu, Pr, or Ce;
   performing a first anneal in a non-oxidizing inert ambient to densify the high-κ gate dielectric; and
   performing a second anneal in an oxidizing ambient.

2. The method of claim 1, wherein said high-κ gate dielectric comprises a metal oxide.

3. The method of claim 1, wherein said first anneal occurs at a temperature on the order of 1000° C.

4. The method of claim 3, wherein said first anneal occurs in a $N_2$ ambient and has a duration on the order of 60 seconds.

5. The method of claim 1, wherein said second anneal occurs at a temperature on the order of 700° C. and has a duration on the order of 60 seconds.

6. The method of claim 5, wherein said second anneal occurs in an $O_2$ ambient.

7. The method of claim 1, wherein a partial pressure of oxidizer during said second anneal is in the range of 1 mTorr to 1 atm.

8. The method of claim 1, wherein said second anneal comprises a thermal anneal.

9. The method of claim 8, wherein said thermal anneal is performed with UV exposure.

10. The method of claim 1, wherein said second anneal comprises a low temperature plasma process.

11. A method for fabricating an integrated circuit, comprising the following steps performed in order:
    depositing a high-κ gate dielectric over a surface of a semiconductor body, wherein said high-κ gate dielectric comprises a metal oxynitride;
    performing a first anneal in a non-oxidizing inert ambient to densify the high-κ oats dielectric; and
    performing a second anneal in an oxidizing ambient.

12. A method for fabricating an integrated circuit, comprising the following steps performed in order:
    depositing a high-κ gate dielectric over a surface of a semiconductor body, wherein said high-κ gate dielectric comprises a metal-silicon-oxide;
    performing a first anneal in a non-oxidizing inert ambient to density the high-κ gate dielectric; and
    performing a second anneal in an oxidizing ambient.

13. A method for fabricating an integrated circuit, comprising the following steps performed in order:
    depositing a high-κ gate dielectric over a surface of a semiconductor body, wherein said high-κ gate dielectric comprises a metal-silicon-oxynitride;
    performing a first anneal in a non-oxidizing inert ambient to density the high-κ gate dielectric; and
    performing a second anneal in an oxidizing ambient.

14. A method for fabricating an integrated circuit, comprising the following steps performed in order:
    depositing a high-κ gate dielectric over a surface of a semiconductor body;
    performing a first anneal in a non-oxidizing inert ambient to density the high-κ gate dielectric; and
    performing a second anneal in an oxidizing ambient, wherein said first anneal is a high temperature anneal and the second anneal is a lower temperature anneal, wherein said lower temperature is lower than said high temperature.

15. A method for fabricating an integrated circuit, comprising the steps of:
    providing a partially processed semiconductor body;
    depositing a high-κ gate dielectric over a surface of the semiconductor body;
    performing a first anneal at a temperature of approximately 1000° C. in a non-oxidizing ambient to densify the high-κ gate dielectric;
    then, performing a second anneal at a temperature of approximately 7000° C. in an oxidizing ambient to reduce interface defects; and
    then, forming a gate electrode material over the high-κ gate dielectric.

16. The method of claim 15 wherein said second anneal is performed at reduced pressure.

17. The method of claim 15, wherein said high-κ gate dielectric comprises a metal-silicon-oxide.

18. The method of claim 15, wherein said high-κ gate dielectric comprises a metal-silicon-oxynitride.

19. The method of claim 15, wherein said high-κ gate dielectric comprises a material selected from the group consisting of MN, MO, MON, MSiO, MSIN, MSiON, MAlO, MAlN, MAlON, MAlSiO, MAlSN, or MAlSiON, where M is Zr, Hf, La, Y, Gd, Eu, Pr, or Ce.

20. A method for fabricating an integrated circuit, comprising the steps of:
   providing a partially processed semiconductor body;
   depositing a high-κ gate dielectric over a surface of the semiconductor body, said high-κ gate dielectric comprising a metal-silicon-oxide or metal-silicon-oxynitride;
   performing a first anneal at a high temperature in a non-oxidizing ambient to densify the high-κ dielectric;
   then, performing a second anneal at a temperature lower than said high temperature in an oxidizing ambient, wherein said second anneal does not significantly increase the effective oxide thickness of said high-κ gate dielectric; and
   then, forming a gate electrode material over the high-κ gate dielectric.

21. The method of claim 20, wherein said metal-silicon-oxide comprises HfSiO.

22. The method of claim 20, wherein said metal-silicon-oxynitride comprises HfSiON.

* * * * *